United States Patent
Xia

(10) Patent No.: US 11,189,704 B2
(45) Date of Patent: Nov. 30, 2021

(54) THIN FILM TRANSISTOR AND ELECTRICAL CIRCUIT

(71) Applicant: TCL CHINA STAR OPTOELECTRONICS TECHNOLOGY CO., LTD., Guangdong (CN)

(72) Inventor: Hui Xia, Guangdong (CN)

(73) Assignee: TCL CHINA STAR OPTOFI FCTRONICS TECHNOLOGY CO.. LTD., Guangdong (CN)

( * ) Notice: Subject to any disclaimer, the term of this patent is extended or adjusted under 35 U.S.C. 154(b) by 0 days.

(21) Appl. No.: 16/616,970

(22) PCT Filed: Jul. 12, 2019

(86) PCT No.: PCT/CN2019/095742
§ 371 (c)(1),
(2) Date: Nov. 26, 2019

(87) PCT Pub. No.: WO2020/248321
PCT Pub. Date: Dec. 17, 2020

(65) Prior Publication Data
US 2020/0388691 A1    Dec. 10, 2020

(30) Foreign Application Priority Data
Jun. 10, 2019    (CN) .......................... 201910496628.8

(51) Int. Cl.
*H01L 29/423*    (2006.01)
*H01L 29/417*    (2006.01)

(52) U.S. Cl.
CPC .. *H01L 29/42384* (2013.01); *H01L 29/41733* (2013.01)

(58) Field of Classification Search
CPC ......... H01L 29/42384; H01L 29/41733; H01L 27/1214; H01L 27/124–1244; H01L 23/4824; G09G 5/003; G09G 3/3677; G09G 3/3688; G09G 3/003; G02F 1/1345–13458
See application file for complete search history.

(56) References Cited

U.S. PATENT DOCUMENTS

| | | | |
|---|---|---|---|
| 6,239,468 B1 | 5/2001 | Chang et al. | |
| 7,750,372 B2 * | 7/2010 | Chang | H01L 27/124 257/202 |
| 2004/0173795 A1 * | 9/2004 | Moon | H01L 29/78669 257/59 |
| 2005/0127365 A1 * | 6/2005 | Koyama | H01L 29/78645 257/72 |

(Continued)

FOREIGN PATENT DOCUMENTS

| | | | | |
|---|---|---|---|---|
| CN | 101369589 A | * | 2/2009 | |
| CN | 100505315 C | | 6/2009 | |
| CN | 109309100 A | * | 2/2019 | ....... H01L 29/41733 |

*Primary Examiner* — Errol V Fernandes
*Assistant Examiner* — Jeremy J Joy
(74) *Attorney, Agent, or Firm* — Mark M. Friedman

(57) ABSTRACT

The present disclosure proposes a thin film transistor and a related circuit. The thin film includes a gate, a drain and a source. The gate includes one or more gate units. The gate unit includes two or more strip-shaped gate branches, and a first gap is arranged between the two adjacent strip-shaped gate branches to separate them.

15 Claims, 3 Drawing Sheets

(56) References Cited

U.S. PATENT DOCUMENTS

| | | | |
|---|---|---|---|
| 2006/0049404 A1* | 3/2006 | Park | H01L 29/42384 |
| | | | 257/59 |
| 2006/0081985 A1* | 4/2006 | Beach | H01L 29/41758 |
| | | | 257/745 |
| 2008/0012023 A1 | 1/2008 | Matsumura et al. | |
| 2011/0001736 A1* | 1/2011 | Tanaka | H01L 27/124 |
| | | | 345/204 |
| 2012/0001189 A1* | 1/2012 | Matsubara | H01L 27/124 |
| | | | 257/59 |
| 2013/0075728 A1* | 3/2013 | Liu | H01L 27/1214 |
| | | | 257/49 |
| 2013/0201610 A1* | 8/2013 | Yamasaki | H01L 27/1251 |
| | | | 361/679.01 |
| 2018/0190645 A1* | 7/2018 | Long | G02F 1/136204 |
| 2019/0317347 A1* | 10/2019 | Huang | H01L 29/41733 |
| 2020/0193932 A1* | 6/2020 | Liu | H01L 29/41733 |

* cited by examiner

THIN FILM TRANSISTOR AND ELECTRICAL CIRCUIT

BACKGROUND

1. Field of the Disclosure

The present disclosure relates to a thin film transistor (TFT), and more particularly, to a TFT and an electrical circuit.

2. Description of Related Art

A gate driver on array (GOA) circuit includes a plurality of thin film is transistors (TFTs). Generally, the structure of the TFT is relatively large to obtain the necessary aspect ratio of a channel. The gate metal of the TFT has a large area, and it is easy to accumulate static electricity. At the same time, the gap between the metals is relatively narrow to meet the design of the narrow bezel, which is easy to cause electrostatic damage to the adjacent metal.

SUMMARY

An object of the present disclosure is to provide a thin film transistor (TFT) and an electrical circuit to manage to deal with a problem that the static electricity is easily accumulated in the TFT used in a conventional circuit and that static electricity easily damage neighboring metals.

According to a first aspect of the present disclosure, a thin film transistor (TFT) comprises:

a gate, comprising one or more gate units, wherein the gate unit comprises two or more strip-shaped gate branches, and a first gap is arranged between the two adjacent strip-shaped gate branches; and a source/drain layer that is insulated from the gate, and disposed above or below the gate, the source/drain layer comprising a drain and a source oppositely arranged;

wherein the two or more strip-shaped gate branches are electrically connected to each other;

a second gap is arranged between the adjacent gate units;

a width of the second gap being greater than a width of the first gap.

Optionally, the gate comprises a metal line; the metal line is arranged on one side of the gate unit; the side of the gate unit adjacent to the metal line is electrically connected to the metal line.

Optionally, each of the gate units comprises two or more connecting portions; each of the connecting portions is in one-to-one correspondence with the strip-shaped gate branches and is electrically connected to the strip-shaped gate branches;

the connecting portions in the same gate unit are electrically connected to each other.

Optionally, the width of the first gap is greater than three micrometers (μm).

Optionally, the gate units is arranged in a first direction; the strip-shaped gate branch is arranged in the first direction;

the source comprises one or more source unit; the source unit is arranged in the first direction; each of the source units comprises a plurality of U-shaped source branches; the U-shaped source branch is arranged in a second direction;

the drain comprises one or more drain unit; the drain unit is disposed in the first direction and opposite to the source unit; the drain unit comprises a plurality of strip-shaped drain branches; the strip drain branches are arranged in a spaced relationship in the second direction;

the strip-shaped drain branch is disposed in an opening of the U-shaped source branch and spaced apart from the U-shaped source branch;

the first direction is perpendicular to the second direction.

Optionally, the gate comprises two gate units; the gate unit comprises two strip-shaped gate branches;

the source comprises the two source units; the drain comprises the two drain units; the two drain units are arranged between the two source units;

the drain unit and the source unit adjacent to the drain unit are disposed correspondingly above each of the gate units.

Optionally, the gate comprises a first gate unit, a second gate unit, and a third gate unit; the first gate unit comprises the two strip-shaped gate branches; the second gate unit comprises the four strip-shaped gate branches; the third gate unit comprises the two strip-shaped gate branches;

the source comprises a first source unit, a second source unit, a third source unit, and a fourth source unit; the first source unit and the second source unit are oppositely disposed; the second source unit and the third source unit are disposed away from each other; the third source unit and the fourth source unit are oppositely disposed;

the drain comprises a first drain unit, a second drain unit, a third drain unit, and a fourth drain unit; the first drain unit and the second drain unit are disposed away from each other; the first drain unit and the second drain unit are disposed between the first source unit and the second source unit; the third drain unit and the fourth drain unit are disposed away from each other; the third drain unit and the fourth drain unit are disposed between the third source unit and the fourth source unit;

the first source unit and the first drain unit are disposed above the first gate unit; the second source unit, the second drain unit, the third source unit, and the third drain unit are disposed above the second gate unit; the fourth source unit and the fourth drain unit are disposed above the third gate unit.

According to a second aspect of the present disclosure, a TFT includes:

a gate, comprising one or more gate units, wherein the gate unit comprises two or more strip-shaped gate branches, and a first gap is arranged between the two adjacent strip-shaped gate branches; and a source/drain layer that is insulated from the gate, and disposed above or below the gate, the source/drain layer comprising a drain and a source oppositely arranged.

Optionally, the two or more strip-shaped gate branches are electrically connected to each other.

Optionally, the gate comprises a metal line; the metal line is arranged on one side of the gate unit; the side of the gate unit adjacent to the metal line is electrically connected to the metal line.

Optionally, each of the gate units comprises two or more connecting portions; each of the connecting portions is in one-to-one correspondence with the strip-shaped gate branches and is electrically connected to the strip-shaped gate branches;

the connecting portions in the same gate unit are electrically connected to each other.

Optionally, a second gap is arranged between the adjacent gate units, and a width of the second gap being greater than a width of the first gap.

Optionally, the width of the first gap is greater than three micrometers (μm).

Optionally, the gate units is arranged in a first direction; the strip-shaped gate branch is arranged in the first direction;

the source comprises one or more source unit; the source unit is arranged in the first direction; each of the source units comprises a plurality of U-shaped source branches; the U-shaped source branch is arranged in a second direction;

the drain comprises one or more drain unit; the drain unit is disposed in the first direction and opposite to the source unit; the drain unit comprises a plurality of strip-shaped drain branches; the strip drain branches are arranged in a spaced relationship in the second direction;

the strip-shaped drain branch is disposed in an opening of the U-shaped source branch and spaced apart from the U-shaped source branch;

the first direction is perpendicular to the second direction.

Optionally, the gate comprises two gate units; the gate unit comprises two strip-shaped gate branches;

the source comprises the two source units; the drain comprises the two drain units; the two drain units are arranged between the two source units;

the drain unit and the source unit adjacent to the drain unit are disposed correspondingly above each of the gate units.

Optionally, the gate comprises a first gate unit, a second gate unit, and a third gate unit; the first gate unit comprises the two strip-shaped gate branches; the second gate unit comprises the four strip-shaped gate branches; the third gate unit comprises the two strip-shaped gate branches;

the source comprises a first source unit, a second source unit, a third source unit, and a fourth source unit; the first source unit and the second source unit are oppositely disposed; the second source unit and the third source unit are disposed away from each other; the third source unit and the fourth source unit are oppositely disposed;

the drain comprises a first drain unit, a second drain unit, a third drain unit, and a fourth drain unit; the first drain unit and the second drain unit are disposed away from each other; the first drain unit and the second drain unit are disposed between the first source unit and the second source unit; the third drain unit and the fourth drain unit are disposed away from each other; the third drain unit and the fourth drain unit are disposed between the third source unit and the fourth source unit;

the first source unit and the first drain unit are disposed above the first gate unit; the second source unit, the second drain unit, the third source unit, and the third drain unit are disposed above the second gate unit; the fourth source unit and the fourth drain unit are disposed above the third gate unit.

According to a third aspect of the present disclosure, a circuit comprises a thin film transistor (TFT). The TFT includes:

a gate comprising one or more gate units, wherein the gate unit comprises two or more strip-shaped gate branches, and a first gap is arranged between the two adjacent strip-shaped gate branches; and a source/drain layer that is insulated from the gate, and disposed above or below the gate, the source/drain layer comprising a drain and a source oppositely arranged.

Optionally, the two or more strip-shaped gate branches are electrically connected to each other.

Optionally, the gate comprises a metal line; the metal line is arranged on one side of the gate unit; the side of the gate unit adjacent to the metal line is electrically connected to the metal line.

Optionally, each of the gate units comprises two or more connecting portions; each of the connecting portions is in one-to-one correspondence with the strip-shaped gate branches and is electrically connected to the strip-shaped gate branches;

the connecting portions in the same gate unit are electrically connected to each other.

Compared with the related art, a gate unit in a gate is divided into two or more strip-shaped gate branches through a first gap in the TFT proposed by the present disclosure to reduce the space the gate occupies, thereby reducing the incidence of electrostatic damage. The present disclosure resolves the technical problem that the TFT of the related art applied in the electrical circuit easily accumulates static electricity, and is prone to electrostatic damage to the neighboring metal.

BRIEF DESCRIPTION OF THE DRAWINGS

The accompanying drawings described herein are used to provide further comprehension of the present disclosure, and is a part of the present application. Schematic embodiments of the present disclosure and the description thereof are used to illustrate the present disclosure, but do not constitute any improper limit to the present disclosure. In the accompanying drawings.

DETAILED DESCRIPTION OF THE EMBODIMENTS

In the present specification, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

Figure 1:
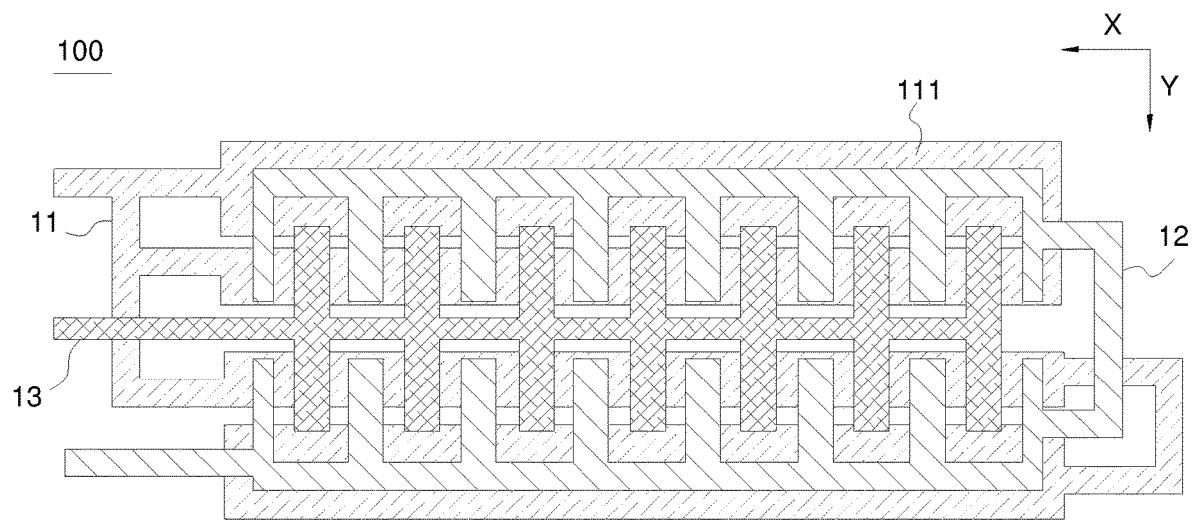
FIG. 1 is a schematic diagram of a thin film transistor (TFT) according to a first embodiment of the present disclosure.
Figure 2:
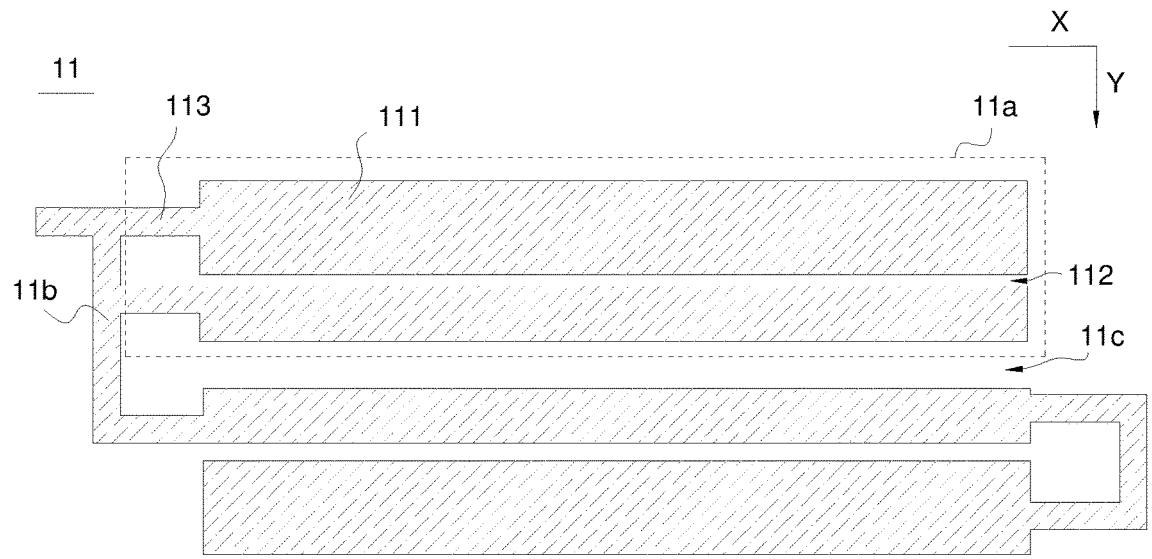
FIG. 2 is a schematic diagram of a gate of the TFT according to the first embodiment.
Figure 3:
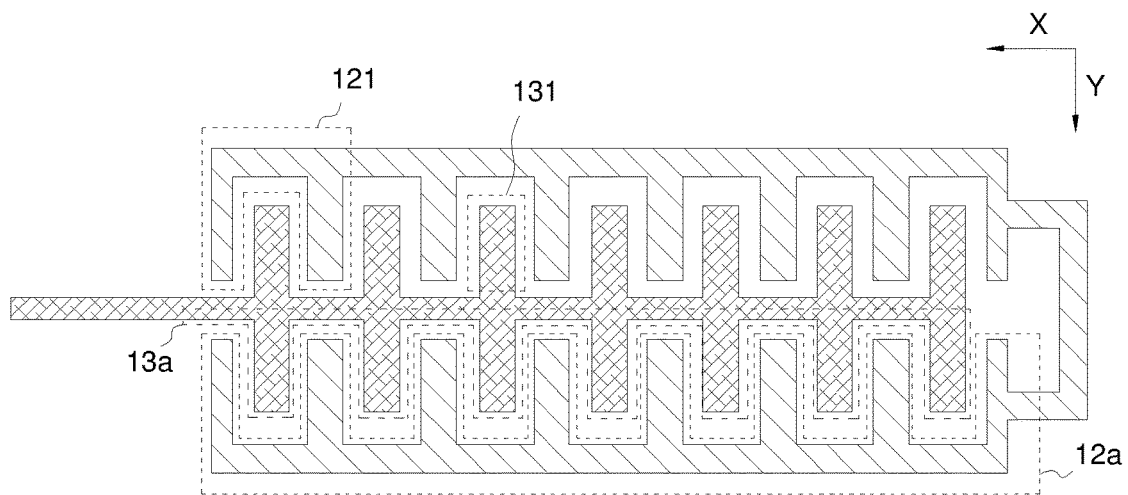
FIG. 3 is a schematic diagram of a source/drain layer of the TFT of the first embodiment.

Please refer to FIG. 1, FIG. 2, and FIG. 3. FIG. 1 is a schematic diagram of a thin film transistor (TFT) according to a first embodiment of the present disclosure. FIG. 2 is a schematic diagram of a gate 11 of the TFT according to the first embodiment. FIG. 3 is a schematic diagram of a source/drain layer of the TFT of the first embodiment. The TFT 10 includes the gate 11 and the source/drain layer. The source/drain layer includes a source 12 and a drain 13. The gate 11 is insulated from the source/drain layer. The gate 11 is arranged above or below the source/drain layer. The drain 13 and the source 12 are oppositely arranged.

The gate 11 includes one or more gate unit 11a. The gate unit 11a includes two or more strip-shaped gate branches 111. A first gap 112 is arranged between the two adjacent strip-shaped gate branches 111. The adjacent strip-shaped gate branches 111 are isolated by the first gap 112.

Each of the gate units 11a of the gate of the TFT 100 of the first embodiment of the present disclosure divides the gate unit 11a into a plurality of strip-shaped gate branches 111 by the first gap 112 to downsize the space that the gate 11 occupies. In turn, the amount of static electricity accumulation is reduced, thereby reducing the incidence of static electricity that hurts neighboring metals.

On the one hand, the more the number of divided strip-shaped gate branch 111 is, the smaller the space the gate 11 occupies. On the other hand, the greater the width of the first gap 112 is, the smaller the space the gate 11 occupies in the process of dividing the gate unit 11a. In another embodiment, the width of a first gap 112 is greater than three micrometers (am).

Although the gate unit 11a in the gate 11 is divided in the first embodiment of the present disclosure, a plurality of strip-shaped gate branches 111 are formed at intervals. However, the function of the TFT 100 in the first embodiment is not substantially affected due to the fringe electric field.

Two or more strip-shaped gate branches 111 are electrically connected to each other; that is, all the strip-shaped gate branches 111 are electrically connected to one another in the first embodiment.

The gate 11 includes a metal line 11b. The metal line 11b is arranged on one side of the gate unit 11a. The side of the gate unit 11a adjacent to the metal line 11b is electrically connected to the metal line 11b. Such a setting facilitates the layout of the gate 11, which consumes less connecting lines.

Each of the gate units 11a includes two or more connecting portions 113. Each of the connecting portions 113 is in one-to-one correspondence with the strip-shaped gate branches 111 and is electrically connected to the strip-shaped gate branches 111. The connecting portions 113 in the same gate unit 11a are electrically connected to each other. In another embodiment, connecting portions 113 in the same gate unit 11a are arranged on the same side of a plurality of strip-shaped gate branches 111 to facilitate the layout of lines, which consumes less wiring materials.

A second gap 11c is provided between the adjacent gate units 11a. The second gap 11c separates the adjacent gate units 11a. The width of the second gap 11c is greater than the width of the first gap 112. Such an arrangement facilitates the layout of the gate unit 11a and the strip-shaped gate branch 111 and the layout of the gate unit 11a corresponding to the layout of the source unit and the drain unit.

The gate units 11a are arranged in a first direction Y. The strip-shaped gate branch 111 is arranged in the first direction Y.

The source 12 includes one or more source unit 12a. The source unit 12a is arranged in the first direction Y. Each of the source units 12a includes a plurality of U-shaped source branches 121. The U-shaped source branch 121 is arranged in a second direction X.

The drain 13 includes one or drain unit 13a. The drain unit 13a is disposed in the first direction Y and opposite to the source unit 12a. The drain unit 13a includes a plurality of strip-shaped drain branches 131. The strip drain branches 131 are arranged in a spaced relationship in the second direction X.

The strip-shaped drain branch 131 is disposed within the opening of the U-shaped source branch 121 and spaced apart from the U-shaped source branch 121. The first direction Y is perpendicular to the second direction X.

The gate 11 includes two gate units 11a. Each of the gate units 11a includes two strip-shaped gate branches 111.

The source 12 includes two source units 12a. The drain 13 includes two drain units 13a. The drain units 13a are arranged between the two source units 12a. The drain unit 13a and the source unit 12a adjacent to the drain unit 13a are disposed correspondingly above each of the gate units 11a.

In the TFT 100 of the first embodiment of the present disclosure, the number of the gate unit 11a and the strip-shaped gate branch 111 in the gate 11 is not limited and may be adjusted if needed.

Figure 4:
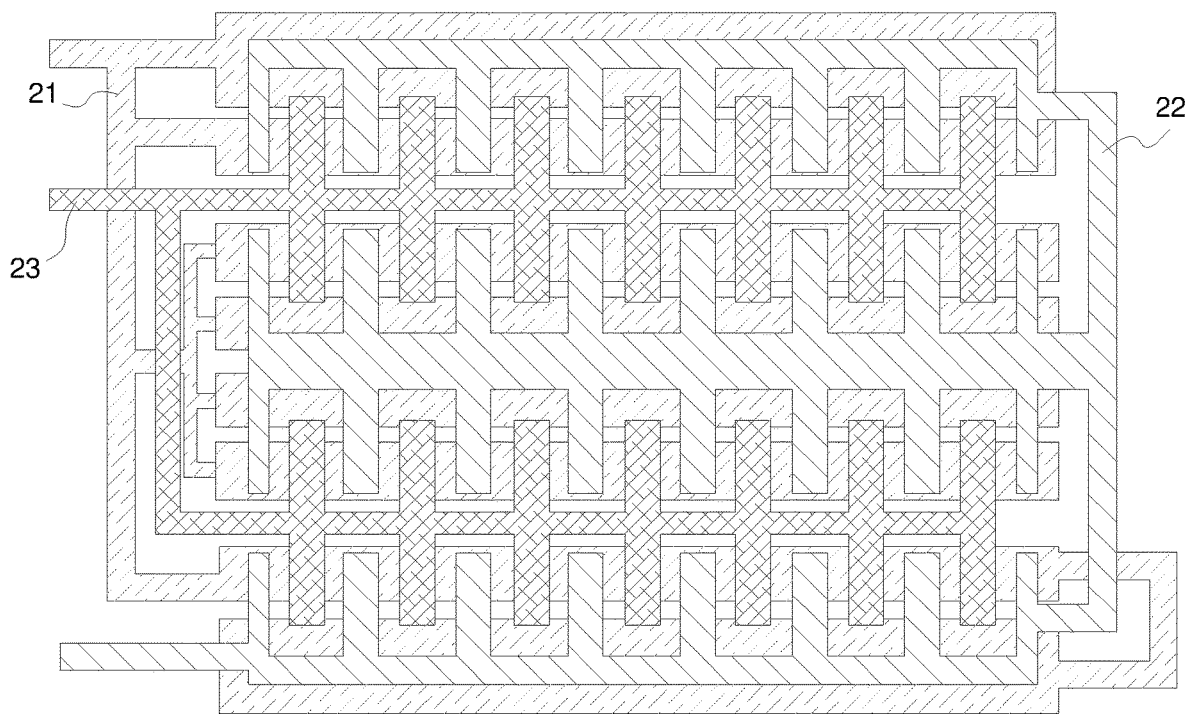
FIG. 4 is a schematic diagram of a thin film transistor (TFT) according to a second embodiment of the present disclosure.
Figure 5:
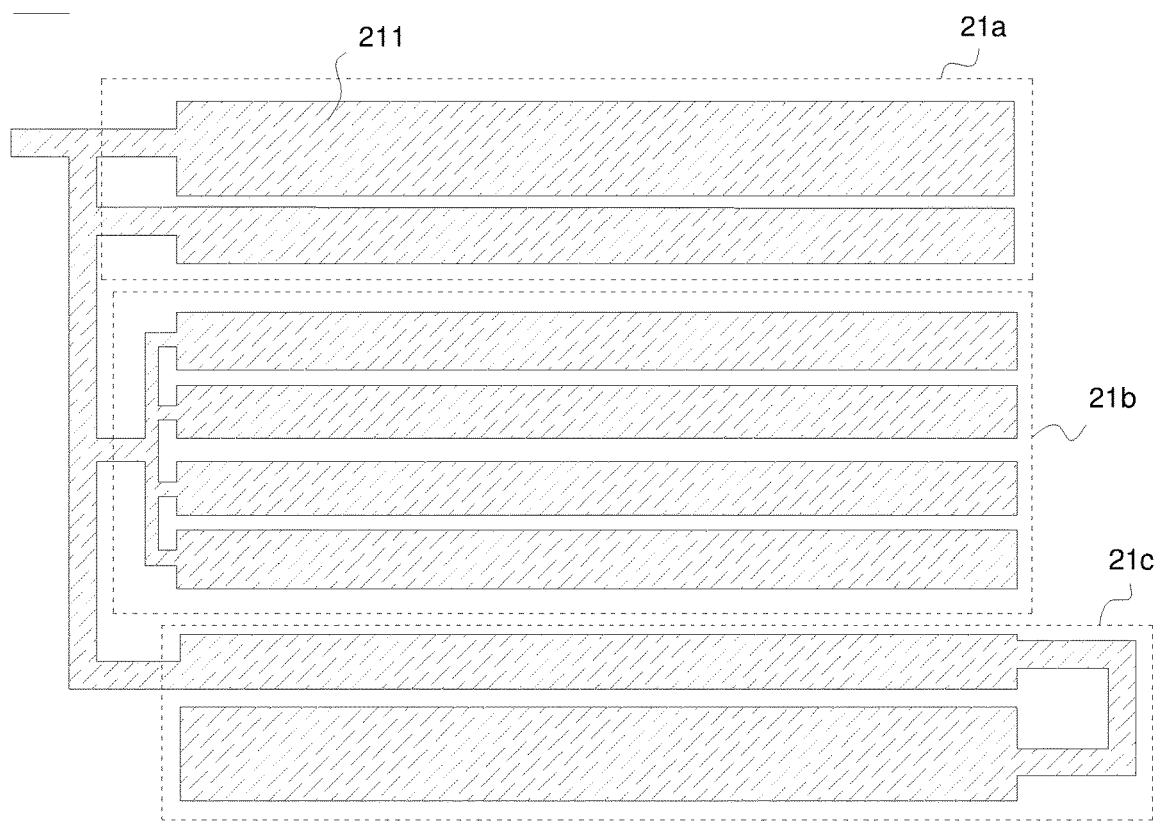
FIG. 5 is a schematic diagram of a gate of the TFT according to the second embodiment.
Figure 6:
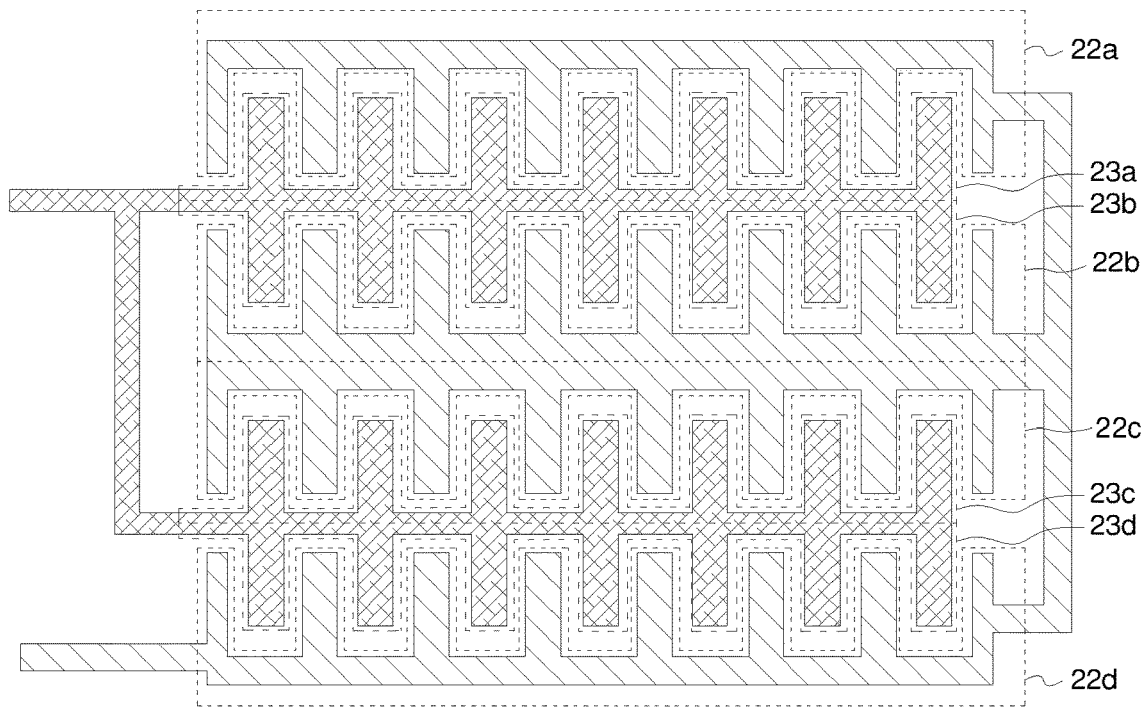
FIG. 6 is a schematic diagram of a source/drain layer of the TFT of the second embodiment.

Please refer to FIG. 4 to FIG. 6. FIG. 4 is a schematic diagram of a thin film transistor (TFT) 200 according to a second embodiment of the present disclosure. FIG. 5 is a schematic diagram of a gate of the TFT 200 according to the second embodiment of the present disclosure. FIG. 6 is a schematic diagram of a source/drain layer of the TFT 200 according to the second embodiment of the present disclosure.

The TFT 200 in the second embodiment is different from the TFT 100 in the first embodiment in that:

The gate 21 includes a first gate unit 21a, a second gate unit 21b, and a third gate unit 21c. The first gate unit 21a includes two strip-shaped gate branches 211. The second gate unit 21b includes four strip-shaped gate branches 211. The third gate unit 21c includes two strip-shaped gate branches 211.

The source 22 includes a first source unit 22a, a second source unit 22b, a third source unit 22c, and a third source unit 22d. The first source unit 22a and the second source unit 22b are oppositely disposed. The second source unit 22b and the third source unit 22c are disposed away from each other. The third source unit 22c and the fourth source unit 22d are oppositely disposed.

The drain 23 includes a first drain unit 23a, a second drain unit 23b, a third drain unit 23c, and a fourth drain unit 23c. The first drain unit 23a and the second drain unit 23b are disposed away from each other and are disposed between the first source unit 22a and the second source unit 22b. The third drain unit 23c and the fourth drain unit 23d are disposed away from each other and are disposed between the third source unit 22c and the fourth source unit 22d.

The first source unit 22a and the first drain unit 23a are disposed above the first gate unit 21a. The second source unit 22b, the second drain unit 23b, the third source unit 22c, and the third drain unit 23c are disposed above the second gate unit 21b. The fourth source unit 22d and the fourth drain unit 23d are disposed above the third gate unit 21c.

Except for the differences as mentioned above, the structure of the TFT 200 in the second embodiment is the same as the structure in the TFT 100 of the first embodiment, which is detailed in the first embodiment.

The present disclosure further proposes an electrical circuit including the TFT 100 and/or the TFT 200. Please refer to the elaboration of the TFT 100 and/or the TFT 200, which can understand the TFT of the electrical circuit proposed by the present disclosure well.

Compared with the related art, a gate unit in a gate is divided into two or more strip-shaped gate branches through a first gap in the TFT proposed by the present disclosure to reduce the space the gate occupies, thereby reducing the incidence of electrostatic damage. The present disclosure resolves the technical problem that the TFT of the related art applied in the electrical circuit easily accumulates static electricity, and is prone to electrostatic damage to the neighboring metal.

Above are embodiments of the present disclosure, which does not limit the scope of the present disclosure. Any modifications, equivalent replacements or improvements within the spirit and principles of the embodiment described above should be covered by the protected scope of the invention.

What is claimed is:

1. A thin film transistor (TFT), comprising:
   a gate, comprising a plurality of gate units, wherein the gate unit comprises two or more strip-shaped gate branches, and a first gap is arranged between the two adjacent strip-shaped gate branches; and
   a source/drain layer that is insulated from the gate, and disposed above or below the gate, the source/drain layer comprising a drain and a source oppositely arranged;
   wherein the two or more strip-shaped gate branches are electrically connected to each other;
   a second gap is arranged between two gate units;
   a width of the second gap is greater than a width of the first gap.

2. The TFT of claim 1, wherein the gate comprises a metal line; the metal line is arranged on one side of the gate unit; the side of the gate unit adjacent to the metal line is electrically connected to the metal line.

3. The TFT of claim 2, wherein each of the gate units comprises two or more connecting portions; each of the connecting portions is in one-to-one correspondence with the strip-shaped gate branches and is electrically connected to the strip-shaped gate branches;
   the connecting portions in the same gate unit are electrically connected to each other.

4. The TFT of claim 1, wherein the width of the first gap is greater than three micrometers ($\mu$m).

5. The TFT of claim 3, wherein the gate units is arranged in a first direction; the strip-shaped gate branch is arranged in the first direction;
   the source comprises one or more source unit; the source unit is arranged in the first direction; each of the source units comprises a plurality of U-shaped source branches; the U-shaped source branch is arranged in a second direction;
   the drain comprises one or more drain unit; the drain unit is disposed in the first direction and opposite to the source unit; the drain unit comprises a plurality of strip-shaped drain branches; the strip drain branches are arranged in a spaced relationship in the second direction;
   the strip-shaped drain branch is disposed in an opening of the U-shaped source branch and spaced apart from the U-shaped source branch;
   the first direction is perpendicular to the second direction.

6. The TFT of claim 5, wherein the gate comprises two gate units; the gate unit comprises two strip-shaped gate branches;
   the source comprises the two source units; the drain comprises the two drain units; the two drain units are arranged between the two source units;
   the drain unit and the source unit adjacent to the drain unit are disposed correspondingly above each of the gate units.

7. The TFT of claim 5, wherein the gate comprises a first gate unit, a second gate unit, and a third gate unit; the first gate unit comprises the two strip-shaped gate branches; the second gate unit comprises the four strip-shaped gate branches; the third gate unit comprises the two strip-shaped gate branches;
   the source comprises a first source unit, a second source unit, a third source unit, and a fourth source unit; the first source unit and the second source unit are oppositely disposed; the second source unit and the third source unit are disposed away from each other; the third source unit and the fourth source unit are oppositely disposed;
   the drain comprises a first drain unit, a second drain unit, a third drain unit, and a fourth drain unit; the first drain unit and the second drain unit are disposed away from each other; the first drain unit and the second drain unit are disposed between the first source unit and the second source unit; the third drain unit and the fourth drain unit are disposed away from each other; the third drain unit and the fourth drain unit are disposed between the third source unit and the fourth source unit;
   the first source unit and the first drain unit are disposed above the first gate unit; the second source unit, the second drain unit, the third source unit, and the third drain unit are disposed above the second gate unit; the fourth source unit and the fourth drain unit are disposed above the third gate unit.

8. A thin film transistor (TFT), comprising:
   a gate, comprising a plurality of gate units, wherein the gate unit comprises two or more strip-shaped gate branches, and a first gap is arranged between the two adjacent strip-shaped gate branches; and
   a source/drain layer that is insulated from the gate, and disposed above or below the gate, the source/drain layer comprising a drain and a source oppositely arranged,
   wherein a second gap is arranged between two gate units, and a width of the second gap being greater than a width of the first gap.

9. The TFT of claim 8, wherein the two or more strip-shaped gate branches are electrically connected to each other.

10. The TFT of claim 9, wherein the gate comprises a metal line; the metal line is arranged on one side of the gate unit; the side of the gate unit adjacent to the metal line is electrically connected to the metal line.

11. The TFT of claim 10, wherein each of the gate units comprises two or more connecting portions; each of the connecting portions is in one-to-one correspondence with the strip-shaped gate branches and is electrically connected to the strip-shaped gate branches;
    the connecting portions in the same gate unit are electrically connected to each other.

12. The TFT of claim 8, wherein the width of the first gap is greater than three micrometers ($\mu$m).

13. The TFT of claim 11, wherein the gate units are arranged in a first direction; the strip-shaped gate branch is arranged in the first direction;
    the source comprises one or more source unit; the source unit is arranged in the first direction; each of the source units comprises a plurality of U-shaped source branches; the U-shaped source branch is arranged in a second direction;
    the drain comprises one or more drain unit; the drain unit is disposed in the first direction and opposite to the source unit; the drain unit comprises a plurality of strip-shaped drain branches; the strip drain branches are arranged in a spaced relationship in the second direction;
    the strip-shaped drain branch is disposed in an opening of the U-shaped source branch and spaced apart from the U-shaped source branch;
    the first direction is perpendicular to the second direction.

14. The TFT of claim 13, wherein the gate comprises two gate units; the gate unit comprises two strip-shaped gate branches;

the source comprises the two source units; the drain comprises the two drain units; the two drain units are arranged between the two source units;

the drain unit and the source unit adjacent to the drain unit are disposed correspondingly above each of the gate units.

15. The TFT of claim 13, wherein the gate comprises a first gate unit, a second gate unit, and a third gate unit; the first gate unit comprises the two strip-shaped gate branches; the second gate unit comprises the four strip-shaped gate branches; the third gate unit comprises the two strip-shaped gate branches;

the source comprises a first source unit, a second source unit, a third source unit, and a fourth source unit; the first source unit and the second source unit are oppositely disposed; the second source unit and the third source unit are disposed away from each other; the third source unit and the fourth source unit are oppositely disposed;

the drain comprises a first drain unit, a second drain unit, a third drain unit, and a fourth drain unit; the first drain unit and the second drain unit are disposed away from each other; the first drain unit and the second drain unit are disposed between the first source unit and the second source unit; the third drain unit and the fourth drain unit are disposed away from each other; the third drain unit and the fourth drain unit are disposed between the third source unit and the fourth source unit;

the first source unit and the first drain unit are disposed above the first gate unit; the second source unit, the second drain unit, the third source unit, and the third drain unit are disposed above the second gate unit; the fourth source unit and the fourth drain unit are disposed above the third gate unit.

* * * * *